United States Patent
Shimizu

[11] Patent Number: 5,753,541
[45] Date of Patent: May 19, 1998

[54] METHOD OF FABRICATING POLYCRYSTALLINE SILICON-GERMANIUM THIN FILM TRANSISTOR

[75] Inventor: Kousaku Shimizu, Tokyo, Japan

[73] Assignee: NEC Corporation, Tokyo, Japan

[21] Appl. No.: 637,286

[22] Filed: Apr. 24, 1996

[30] Foreign Application Priority Data

Apr. 27, 1995 [JP] Japan ................... 7-103641

[51] Int. Cl.$^6$ .................................. H01L 21/268
[52] U.S. Cl. .................. 438/161; 438/162; 438/166; 438/487; 257/63; 257/65; 148/DIG. 58
[58] Field of Search ................... 437/21, 40 TFT, 437/41 TFT, 173, 174, 109, 131; 148/DIG. 58, DIG. 59; 257/19, 63, 65, 66, 347; 438/161, 166, 162, 308, 487

[56] References Cited

U.S. PATENT DOCUMENTS

| | | | |
|---|---|---|---|
| 4,740,829 | 4/1988 | Nakagiri et al. | 257/65 |
| 5,246,886 | 9/1993 | Sakai et al. | 437/131 |
| 5,250,818 | 10/1993 | Saraswat et al. | 257/66 |
| 5,354,700 | 10/1994 | Hunag et al. | 437/40 TFT |
| 5,461,250 | 10/1995 | Burghartz et al. | 257/66 |
| 5,591,653 | 1/1997 | Sameshima et al. | 437/40 TFT |

FOREIGN PATENT DOCUMENTS

| | | |
|---|---|---|
| 1-248668 | 10/1989 | Japan. |
| 1-276765 | 11/1989 | Japan. |
| 3-165067 | 7/1991 | Japan. |
| 3-166767 | 7/1991 | Japan. |
| 4-35019 | 2/1992 | Japan. |
| 4-349615 | 12/1992 | Japan. |
| 4-349616 | 12/1992 | Japan. |
| 4-349617 | 12/1992 | Japan. |
| 4-349618 | 12/1992 | Japan. |
| 6-120499 | 4/1994 | Japan. |

OTHER PUBLICATIONS

English language abstract of JP 4-35019 (Nagahara et al.), Feb. 1992.

A. Slaoui et al., Appl. Phys. A 59(1994)203 "Fabrication and doping of poly–SiGe using excimer–laser processing", 1994.

T.W. Little et al., Jpn. J. Appl. Phys. 30(12B)(1991)3724 "Low temperature poly–Si TFTs . . . ", Dec. 1991.

A. Slaoui et al., Appl. Surf. Sci., 86 (1995)346 "Formation of poly–SiGe using excimer–laser processing", Feb. 1995.

Primary Examiner—Charles L. Bowers, Jr.
Assistant Examiner—Leon Radomsky
Attorney, Agent, or Firm—Sughrue, Mion, Zinn, Macpeak & Seas, PLLC

[57] ABSTRACT

A method for fabricating a silicon-germanium thin film field effect transistor (TFT) with a high carrier mobility and a high on/off ratio. An amorphous silicon layer, an amorphous germanium layer and a gate insulating film are successively layered on an insulating substrate on which a pair of source and drain electrodes are formed. Next, the amorphous silicon layer and the amorphous germanium layer are converted into polycrystalline layers by thermal annealing at a temperature higher than 600° C. or laser annealing. Then, a gate electrode is formed on the gate insulating film.

10 Claims, 7 Drawing Sheets

METHOD OF FABRICATING POLYCRYSTALLINE SILICON-GERMANIUM THIN FILM TRANSISTOR

BACKGROUND OF THE INVENTION

1. Field of the Invention

This invention relates to a method of fabricating a thin film field effect transistor (hereinafter referred to as thin film transistor) applied to a liquid crystal display unit, a projection television apparatus or a like apparatus, and more particularly to a method of fabricating a thin film transistor for which a polycrystalline silicon film is used.

2. Description of the Prior Art

A solid phase growth method or an excimer laser method has been used widely as a method of forming a thin film transistor (TFT), for which a polycrystalline silicon film is used, on an insulating substrate. In the solid phase growth method or the excimer laser method, it is a common practice to first deposit an amorphous silicon film on a substrate using such a method as a sputtering method, a plasma CVD (chemical vapor deposition) method, a CVD method under reduced pressure or a thermal CVD method and then apply thermal energy to convert the amorphous silicon film into a polycrystalline silicon film. For example, in production of a polycrystalline silicon thin film transistor on a transparent insulating substrate using a high temperature solid phase growth method, an amorphous silicon film is conventionally converted into a polycrystalline silicon film by annealing for more than one hour at the temperature of approximately 1000° C. or for more than 10 hours at approximately 700° C. In this instance, as the insulating substrate, a quartz substrate whose melting point is approximately 1,550° C. is used. Also in a method of irradiating excimer laser or argon laser to convert an amorphous silicon film into a polycrystalline silicon film to form a thin film transistor, a high temperature is required in most cases for activation of an impurity (phosphor or boron) or for promotion of quality in a gate insulating film.

Generally, an amorphous substance which is in a non-equilibrium state or metastable state is crystallized by application of energy from the outside, thereby entering a stable state. The crystallization proceeds by a thermal process or a chemical process or by a combination of a thermal process and a chemical process.

The characteristic of a thin film transistor is influenced significantly by the crystal property of each polycrystalline silicon film, and if a polycrystalline silicon film contains a portion of low crystallinity, the mobility of carriers is dropped by the low crystallinity, resulting in degradation of the electric characteristic of the thin film transistor. Therefore, various attempts are conducted in order to allow a polycrystalline silicon film of a higher crystallinity to be formed on an insulating substrate.

For example, Japanese Patent Laid-Open Application No. Heisei 4-35019 (JP, A, 4-35019) discloses a method wherein a polycrystalline layer of germanium, which is easier to crystallize than silicon, is first grown on a glass substrate and then a polycrystalline silicon layer is formed by hetero-epitaxial growth.

Japanese Patent Laid-Open Application No. Heisei 4-349617 (JP, A, 4-349617) discloses a method wherein a silicon film is hetero-epitaxially grown on a polycrystalline praseodymium oxide layer. Similarly, Japanese Patent Laid-Open Application No. Heisei 4-349618 (JP, A, 4-349618) discloses another method wherein a silicon film is hetero-epitaxially grown on a polycrystalline strontium titanate. In the above Japanese Patent Laid-Open Applications Nos. Heisei 4-349617 and 4-349618, it is described that, in order to promote the crystallization process of silicon, the lattice constant of a polycrystalline film which makes a seed for crystallization upon formation of a polycrystalline silicon film should approximate that of silicon.

Meanwhile, Japanese Patent Laid-Open Application No. Heisei 4-349616 (JP, A, 4-349616) discloses a method wherein, after an amorphous silicon film is formed on a glass substrate, calcium fluoride which has a lattice constant proximate to that of polycrystalline silicon is grown on the amorphous silicon film to promote generation of nuclei in the silicon film thereby to convert the silicon film into a polycrystalline silicon film in a shorter time than ever. Further, in Japanese Patent Laid-Open Application No. Heisei 4-349615 (JP, A, 4-349615), it is disclosed that, by using silane ($SiH_4$) and silicon tetrafluoride ($SiF_4$) as raw material gases, the crystallization process is promoted by an action of fluorine atoms and hydrogen atoms mixed in the thus formed amorphous silicon film, resulting in production of crystal of large particle sizes.

However, where a polycrystalline film of praseodymium oxide, strontium titanate or calcium fluoride is grown on a substrate in order to promote crystallization of an amorphous silicon film, upon etching process or patterning process in manufacture of a thin film transistor, a component of the polycrystalline film solves out but a small amount, and the thus solving out component sometimes penetrates into the semiconductor layer, which is one of problems of the conventional methods described above. Particularly where an alkaline earth metal element such as calcium or strontium solves out upon etching, a problem arises in that the solved out alkaline earth metal element diffuses into the inside of the semiconductor layer and deteriorates the characteristic or the reliability of the thin film transistor.

Where a polycrystalline germanium layer is formed first and then a silicon layer is epitaxially grown on the polycrystalline germanium layer to form a thin film transistor as disclosed in Japanese Patent Laid-Open Application No. Heisei 4-35019 (JP, A, 4-35019), a low resistance layer made of germanium is formed between the source electrode and the drain electrode of the thin film transistor and makes it liable for leak current to flow. An increase of the leak current brings about a drop of the bright-dark ratio. If the polycrystalline germanium layer is formed with a reduced thickness in order to decrease the leak current, this decreases the size of crystal particles in the polycrystalline layer and reduces the mobility of carriers in the thin film transistor, and besides, this gives rise to another problem that uniformity in characteristic cannot be obtained.

As a method of forming a germanium film on a substrate, a glow discharge method and a thermal decomposition method are conventionally known, and germane ($GeH_4$) gas is widely used as a raw material gas. However, where a germanium film is deposited in this manner, there are problems that it is difficult to control the amount of hydrogen in the film and that germanium is liable to be oxidized. Further, as a method of forming a polycrystalline germanium film on a substrate while reducing the amount of hydrogen in the film, a method wherein a polycrystalline germanium film is formed in the temperature condition of 450° C. using disilane ($Si_2H_8$) and germanium fluoride ($GeF_4$) as a raw material gas as disclosed, for example, in Applied Physics Letters, Vol. 63, No. 18, pp. 2508–2510 (1993) is known. This method, however, is disadvantageous in that crystal nuclei are produced readily and besides it is difficult to control the production of crystal nuclei.

SUMMARY OF THE INVENTION

It is an object of the present invention to provide a method wherein a thin film transistor for which a polycrystalline silicon film is used and which exhibits a high mobility of carriers (typically 130 cm$^2$/Vs or more), low leak current and a high on/off ratio (typically $10^6$ or more) and is superior in uniformity and reliability in characteristic can be produced on a substrate.

The object of the present invention is achieved by a method of fabricating a polycrystalline silicon-germanium thin film transistor on an insulating substrate, characterized in that it comprises the steps of forming a conductive thin film on the insulating substrate and patterning the conductive thin film to form a source electrode and a drain electrode, successively layering an amorphous silicon layer, an amorphous germanium layer and an insulating film on the insulating substrate on which the source electrode and the drain electrode are formed, and converting the amorphous silicon layer and the amorphous germanium layer into polycrystalline layers and forming a gate electrode on the insulating film by patterning.

In the present invention, for the insulating substrate, a transparent insulating substrate such as, for example, a glass substrate or a quartz substrate can be used, and also an insulating substrate having a silicon nitride film or a like film formed on the surface thereof may be used.

The amorphous germanium layer and the amorphous silicon layer can be formed by a known method such as a plasma CVD method, a thermal CVD method, an LPCVD (low-pressure CVD) method or a sputtering method. Here, where the amorphous germanium layer is formed by a glow discharging method using a raw material gas containing fluorine and germane and the amorphous silicon layer is formed by a glow discharging method using a raw material gas containing fluorine and silane, crystallization is further promoted by an action of fluorine atoms and hydrogen atoms mixed in the thus formed layers. For the glow discharging method in this instance, typically a plasma CVD method which uses a substrate temperature lower than 300° C. is used.

As hereinafter described, since the amorphous germanium layer is a layer for promoting recrystallization of the amorphous silicon layer, it is formed with a relatively small thickness comparing with the amorphous silicon layer. The amorphous germanium layer is preferably formed with a film thickness greater than 2 nm but smaller than 20 nm. Further, where annealing by radiation of laser light is involved, preferably an ultraviolet laser such as an excimer laser is used.

In the present invention, the amorphous silicon layer and the amorphous germanium layer are successively formed on an insulating substrate on which a source electrode and a drain electrode are formed, and then, annealing by irradiation of laser light or annealing at a temperature higher than 600° C. by heating is performed to convert the amorphous germanium layer and the amorphous silicon layer into polycrystalline layers. Since the germanium layer is formed as an amorphous layer on the insulating substrate, the substrate temperature upon film formation can be made lower comparing with that by the conventional method wherein a polycrystalline germanium layer is formed on a substrate.

Since the germanium has a lower melting point than the silicon, it is liable to be recrystallized comparing with the silicon, and on the interface between the germanium layer and the silicon layer, the silicon has its recrystallization temperature lowered due to the presence of an eutectic point of the silicon-germanium. Therefore, application of heat or light to promote recrystallization of the amorphous germanium layer will result in progress of recrystallization of the amorphous silicon layer at a lower temperature than that by the conventional methods. More particularly, by annealing for a short time at a temperature of approximately 600° C. lower than the annealing temperature required when only the amorphous silicon layer is present, recrystallization of the amorphous silicon layer takes place. Since the germanium absorbs ultraviolet rays efficiently, even by irradiating light from an ultraviolet layer, a temperature rise occurs so that recrystallization of the amorphous silicon layer can take place. Further, where irradiation of laser light is employed, the amorphous germanium layer or the amorphous silicon layer adjacent the amorphous germanium layer can be selectively heated, and also contribution of an opto-chemical process can be anticipated. Consequently, annealing can be performed at a further lower temperature without heating the insulating substrate and so forth to a high temperature.

After all, according to the present invention, a polycrystalline silicon layer can be formed by a step which is performed at a temperature lower than ever, and a thin film transistor which is high in mobility of carriers and on/off ratio and superior in uniformity in characteristic and reliability can be provided on an insulating substrate.

The above and other objects, features and advantages of the present invention will become apparent from the following description with reference to the accompanying drawings which illustrate examples of the prevent invention.

DESCRIPTION OF THE PREFERRED EMBODIMENTS

Figure 1:
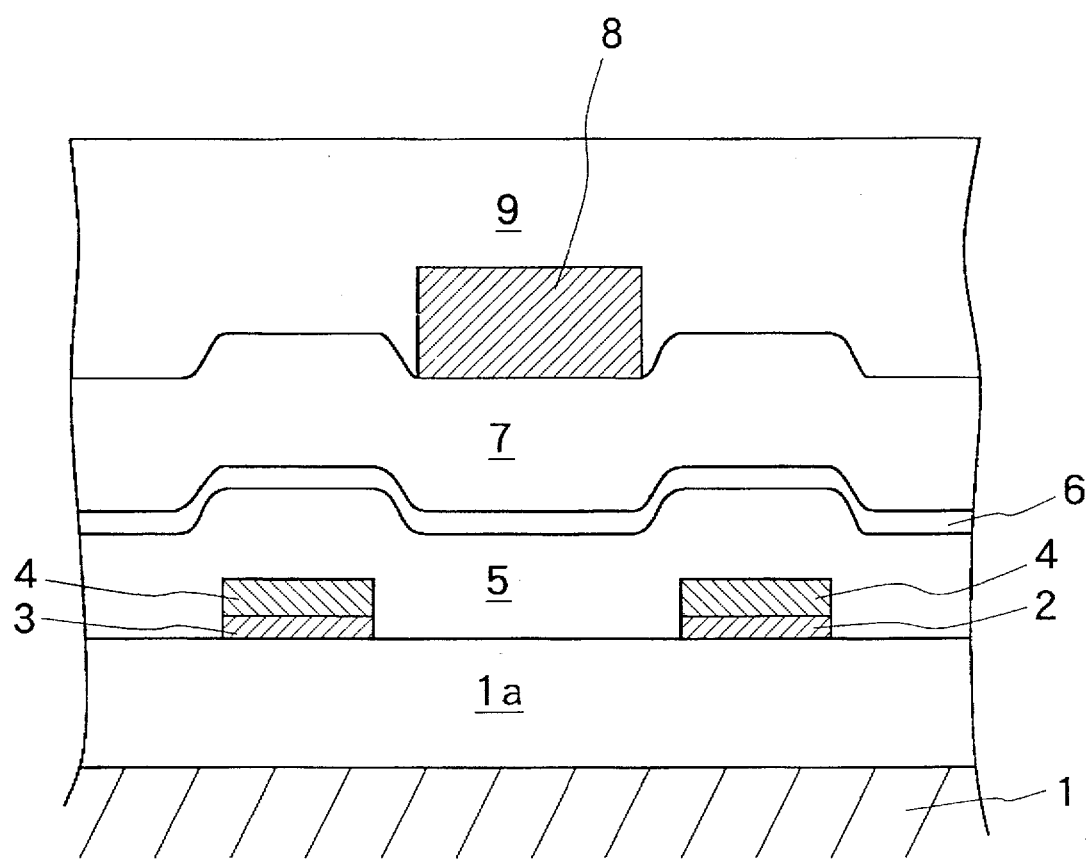
FIG. 1 is a sectional view showing the structure of an example of a polycrystalline silicon-germanium thin film transistor according to the present invention.

In the polycrystalline silicon (Si)-germanium (Ge) thin film transistor shown in FIG. 1, a source electrode 2 and a drain electrode 3 patterned in predetermined shapes are provided on a glass substrate 1 having a silicon nitride layer 1a formed on the surface thereof. A polycrystalline silicon layer 5 is provided in such a manner as to cover over the source electrode 2, the n drain electrode 3 and the silicon nitride layer 1a, and a polycrystalline germanium layer 6 thinner than the polycrystalline silicon layer 5 and a gate insulating film 7 formed from a silicon nitride film are layered in this order on the polycrystalline silicon layer 5. A gate electrode 8 is formed at a location on the gate insulating film 7 between the source electrode 2 and the drain electrode 3, and a passivation layer 9 formed from a silicon nitride film is provided in such a manner as to cover over the gate insulating film 7 and the gate electrode 8. An ohmic contact layer 4 is disposed along an interface between the source electrode 2 and the polycrystalline silicon layer 5 and another interface between the drain electrode 3 and the polycrystalline silicon layer 5. Actual examples of manufacture of the thin film transistor are described below.

EXAMPLE 1

First, the source electrode 2 and the drain electrode 3 as well as the ohmic contact layer 4 were patterned on the transparent glass substrate 1 on which the silicon nitride layer 1a of 200 nm thick was formed. A tungsten silicide film of 20 nm thick formed by a sputtering method was used for each of the source electrode 2 and the drain electrode 3, and an amorphous n⁺-silicon film of 50 nm thick was used for the ohmic contact layer 4. Thereafter, an amorphous silicon layer 5a was formed with the thickness of 100 nm, an amorphous germanium layer 6a was formed with the thickness of 15 nm, and then a silicon nitride film to make the gate insulating film 7 was formed with the thickness of 70 nm. Then, in order to remove hydrogen in the thus layered thin films, annealing was performed in vacuum for two hours.

Figure 2:
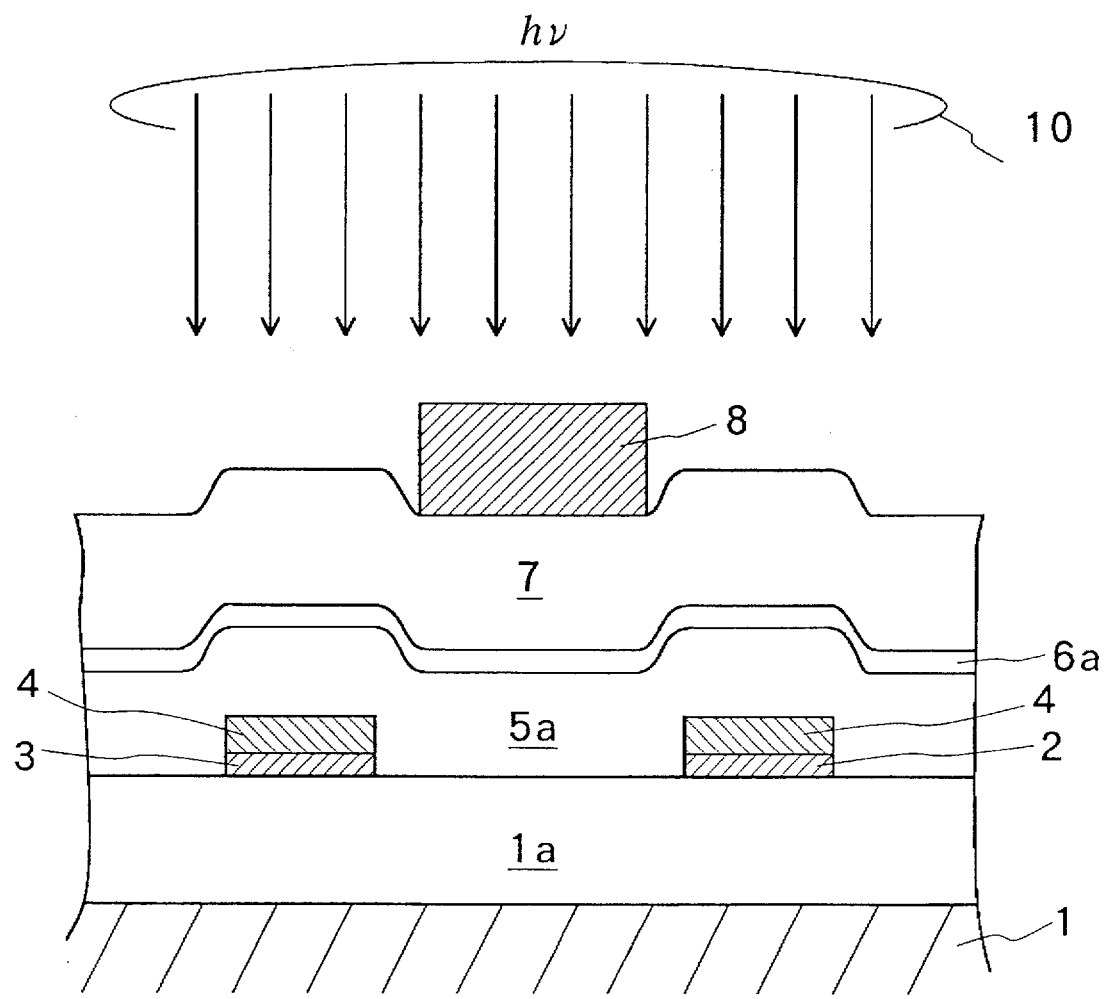
FIG. 2 is a sectional view illustrating a step of converting an amorphous germanium layer and an amorphous silicon layer into polycrystalline layers by irradiation of laser light.

Then, in order to convert the amorphous silicon layer 5a and the amorphous germanium layer 6a into polycrystalline to form the polycrystalline silicon layer 5 and the polycrystalline germanium layer 6, respectively, laser light 10 from an excimer layer (XeCl) was irradiated from the gate insulating film 7 side as seen in FIG. 2 to perform laser annealing. As irradiation conditions, the wavelength and the power were 304 nm and 400 mJ/cm², respectively, and irradiation (laser shot) upon the same locations was performed three times in vacuum. A simulation was conducted based on the irradiation conditions just described. The simulation proved that, by the laser shots, the amorphous silicon layer 5a and the amorphous germanium layer 6a are heated to a temperature a little higher than 600° C. Thereafter, a chromium (Cr) layer was formed with the thickness of 100 nm by a sputtering method, and then, patterning of the chromium film was performed to form a gate electrode 8. Finally, a silicon nitride film was formed as the passivation layer 9 with the thickness of 300 nm.

The thin film formation conditions of the layers are such as described below. The amorphous n⁺-silicon film which forms the ohmic contact layer 4 was deposited using a plasma CVD method and using phosphine (PH₃) as a dopant. As the deposition conditions, the flow rates of silane gas, hydrogen–0.1% phosphine gas (phosphine gas diluted to 0.1% with hydrogen) and hydrogen gas were 300, 450 and 150 SCCM, and the power density was 0.015 W/cm², the gas pressure was 100 Pa and the substrate temperature was 250° C. The deposition rate then was 25 nm/minute. The unit SCCM is a representation in units of cm³ of a flow rate of gas as converted into that in the standard condition (0° C., 1 atmosphere). The amorphous silicon layer 5a was formed by a plasma CVD method under the conditions of power density of 0.04 W/cm², the gas pressure of 120 Pa and the substrate temperature of 250° C. while the silane (SiH₄) gas and the hydrogen gas were made to flow at the flow rates of 90 and 270 SCCM, respectively. The deposition rate then was 2.5 nm/minute. The amorphous germanium layer 6a is formed by a plasma CVD method under the conditions of the power density of 0.02 W/cm², the gas pressure of 120 Pa and the substrate temperature of 250° C. making the germane (GeH₄) gas and the hydrogen gas flow at the flow rates of 30 and 270 SCCM, respectively. The deposition rate then was 1.5 nm/minute. Further, the silicon nitride film constructing the gate insulating film 7 was formed by a plasma CVD method under the conditions of the density of 0.08 W/cm², gas pressure of 120 Pa and substrate temperature of 300° C. making the silane, ammonia and nitrogen gas flow at the flow rates of 100, 200 and 2,000 SCCM, respectively. The deposition rate then was 31.6 nm/minute.

In the present Example 1, plasma etching was employed in order to perform patterning. The etching conditions in this instance were 0.48 W/cm² in power density, 30 Pa in gas pressure and 30° C. in substrate temperature using sulfur hexafluorine (SF₆) gas, hydrogen gas and chlorine gas and making them flow at the flow rates of 30, 30 and 120 SCCM, respectively. The etching rate then was 2 nm/minute.

In the method of fabricating a thin film transistor of Example 1 described above, the amorphous silicon layer 5a or an amorphous n⁺-silicon film forming the ohmic contact layer 4 can alternatively be formed by an LPCVD method or a sputtering method. Further, in place of annealing by irradiation of laser light, solid phase growth method wherein the amorphous n⁺-silicon film is heated to a temperature, for example, higher than 600° C. in an annealing furnace may be employed to convert it into a polycrystalline layer.

EXAMPLE 2

An amorphous n⁺-silicon film of the film thickness of 20 nm forming an ohmic contact layer, an amorphous silicon layer of the film thickness of 80 nm and an amorphous germanium layer of the film thickness of 20 nm were successively formed by a plasma CVD method in a similar manner as in Example 1. Thereafter, in order to discharge hydrogen in the amorphous n⁺-silicon film, the amorphous silicon layer and the amorphous germanium layer, they were heated to 400° C. for 30 minutes in vacuum, and immediately after that, a silicon oxide film as a gate oxide film was formed with the thickness of 300 nm at the substrate temperature of 200° C. by a sputtering method. Thereafter, similarly as in Example 1, the amorphous silicon layer and the amorphous germanium layer were converted into polycrystalline layers using laser annealing.

In the present Example 2, the substrate temperature dependencies of the deposition rate of the amorphous silicon (Si) layer and the amorphous germanium layer (Ge) and the substrate temperature dependencies of the intra-film hydrogen concentration of the amorphous silicon layer and the amorphous germanium layer were investigated. The amorphous n⁺-silicon film was deposited under the conditions of plasma power density of 0.02 W/cm² and gas pressure of 50 Pa making the argon–5% fluorine gas, the silane gas and the hydrogen–0.1% phosphine gas flow at the flow rates of 20, 25 and 20 SCCM, respectively. The amorphous silicon layer was formed under the conditions of plasma power density of 0.02 W/cm² and gas pressure of 50 Pa making the argon–5% fluorine gas and the silane gas flow at the flow rates of 20 and 25 SCCM, respectively. Further, the amorphous germanium layer was formed under the conditions of plasma power density of 0.01 W/cm² and gas pressure of 50 Pa making the argon–5% fluorine gas and the germane gas flow at the flow rates of 20 and 35 SCCM, respectively.

Figure 3:
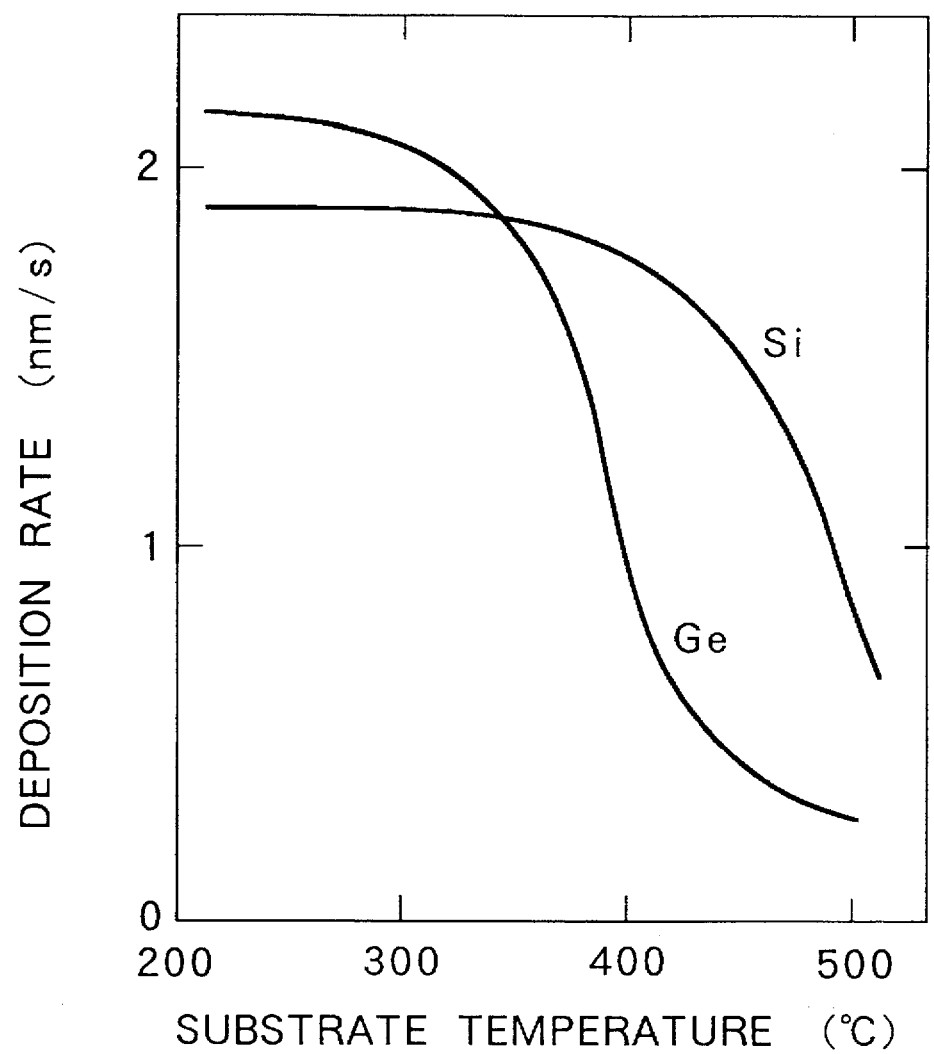
FIG. 3 is a graph illustrating the dependencies of the deposition rate of an amorphous silicon layer and an amorphous germanium layer on the substrate temperature upon film formation.
Figure 4:
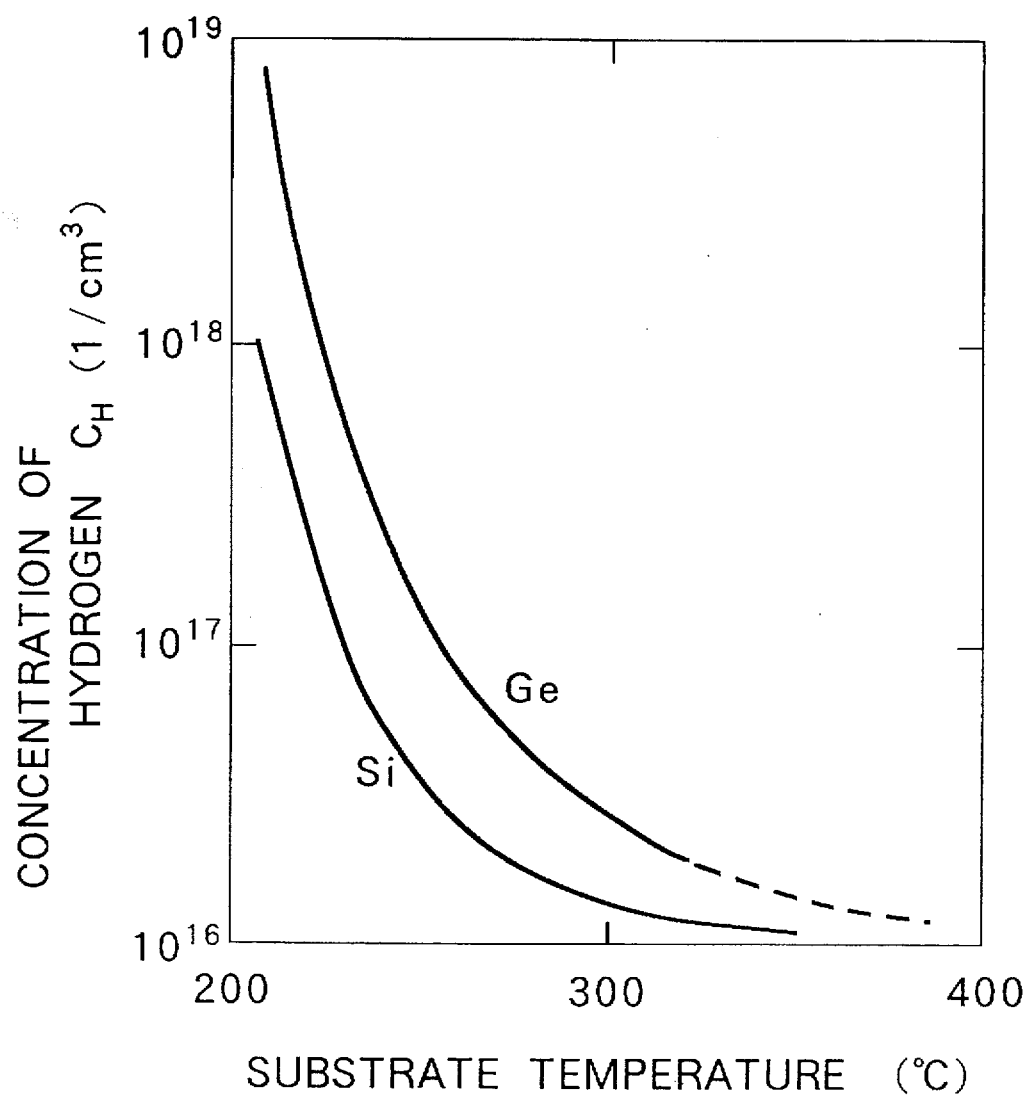
FIG. 4 is a graph illustrating the dependencies of the intra-film hydrogen concentration of an amorphous silicon layer and an amorphous germanium layer on the substrate temperature upon film formation.

FIG. 3 is a graph illustrating the substrate temperature dependencies of the deposition rate. As regards the germanium layer, where it was formed at a substrate temperature higher than 350° C., as the deposition rate dropped suddenly, microcrystalline was observed in the film. Further, where the substrate temperature exceeded 400° C., a structure of polycrystalline germanium was confirmed by observation under an electronic microscope. On the other hand, at a substrate temperature lower than 300° C., the germanium film remains in an amorphous condition. Meanwhile, FIG. 4 is a graph illustrating the substrate temperature dependencies of the intra-film hydrogen concentration. A sudden decrease of the intra-film hydrogen concentration with respect to a rise of the substrate temperature was confirmed.

EXAMPLE 3

Thin film transistors wherein the film thickness of the amorphous silicon layer was 80 nm, the film thickness of the gate insulating film was 200 nm, the channel length L was 8 μm and the channel width W was 6 μm were produced varying the film thickness of the amorphous germanium layer to various values. The relationship between the film thickness of the amorphous germanium layer and the off current (when the gate voltage $V_g=0$ V) was examined. As the film thickness of the amorphous germanium layer increases, the off current increases, and in order to keep the off current lower than $5 \times 10^{-10}$ A, preferably the film thickness of the amorphous germanium layer should be made lower than 20 nm.

Figure 5:
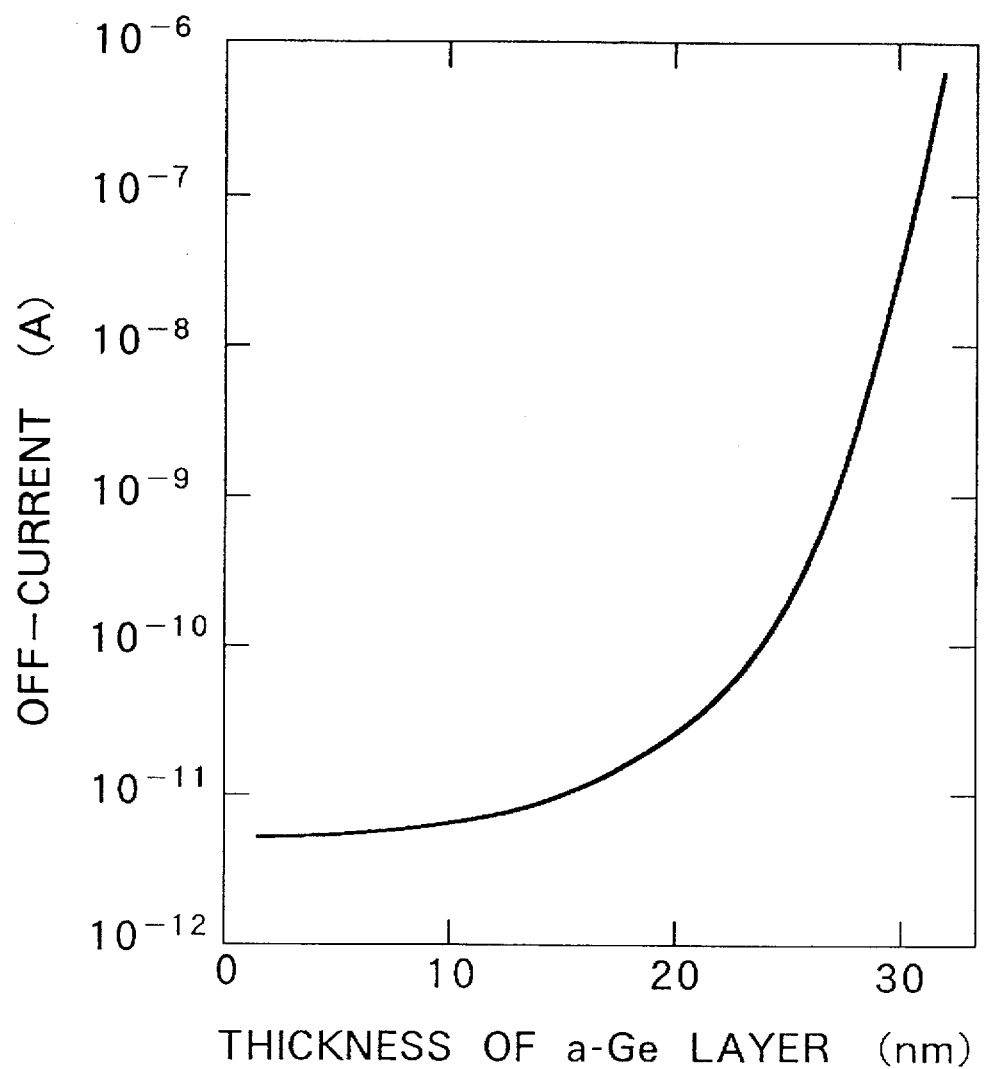
FIG. 5 is a graph illustrating the relationship between the film thickness of an amorphous germanium layer and the off current.
Figure 6:
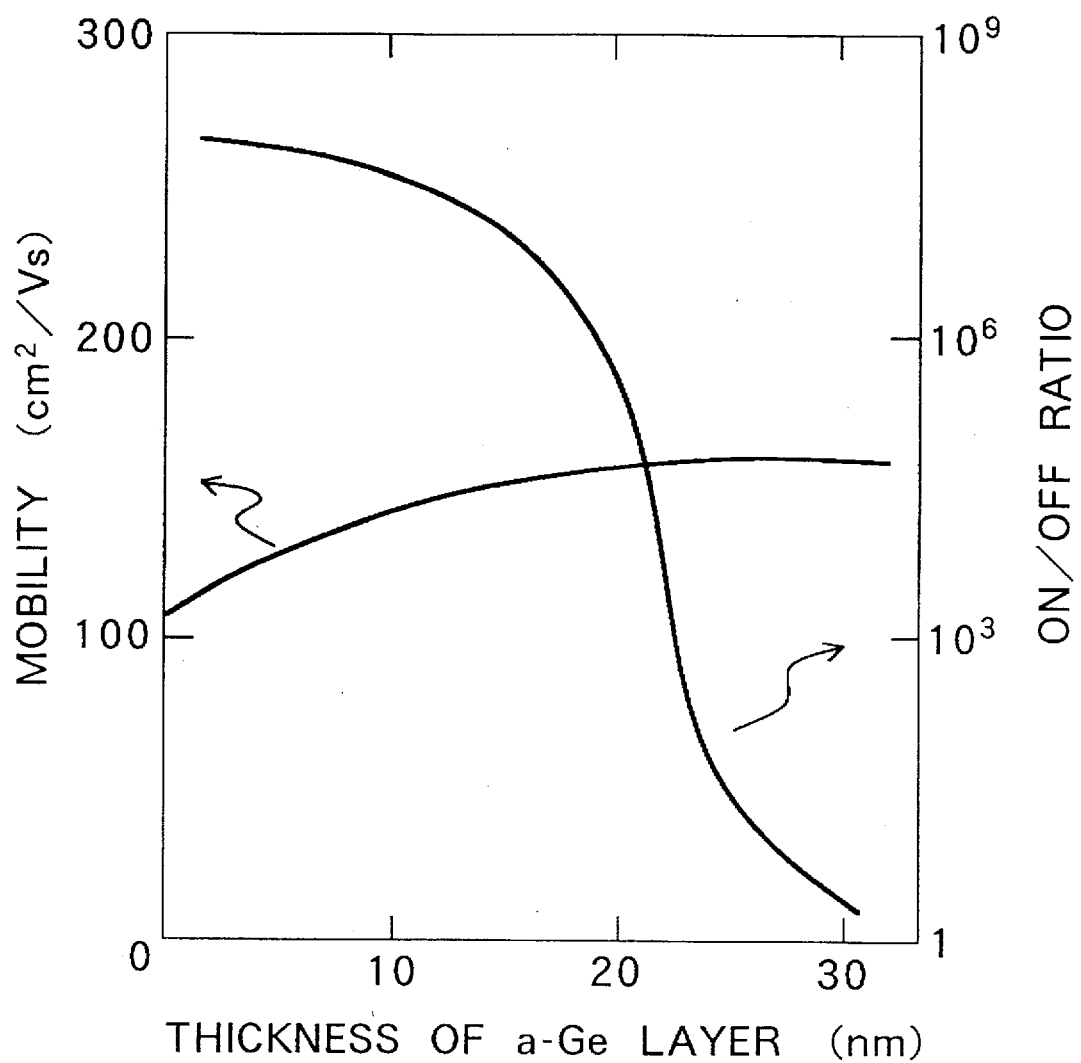
FIG. 6 is a graph illustrating the dependencies of the electron mobility and the on/off ratio of a silicon-germanium thin film transistor on the film thickness of an amorphous germanium layer.

Also the relationship of the electron mobility and the on/off ratio (ratio between the on current and the off current) of the thin film transistors to the film thickness of the amorphous germanium layer was examined. The off current is the current value when the gate voltage $V_g$ is set to $V_g=0$ V, and the on current is the current value when the gate voltage V is set to $V_g=15$ V. Results are illustrated in FIG. 6. As the film thickness of the amorphous germanium layer increases, the electron mobility is inclined to increase, but the on/off ratio is inclined to decrease suddenly. This principally arises from a sudden increase of the off current (refer to FIG. 5). Accordingly, it can be seen that, in order to obtain a mobility higher than 130 cm²/Vs and a on/off ratio higher than $10^6$, preferably the film thickness of the amorphous germanium layer should be greater than 2 nm but smaller than 20 nm.

Figure 7:
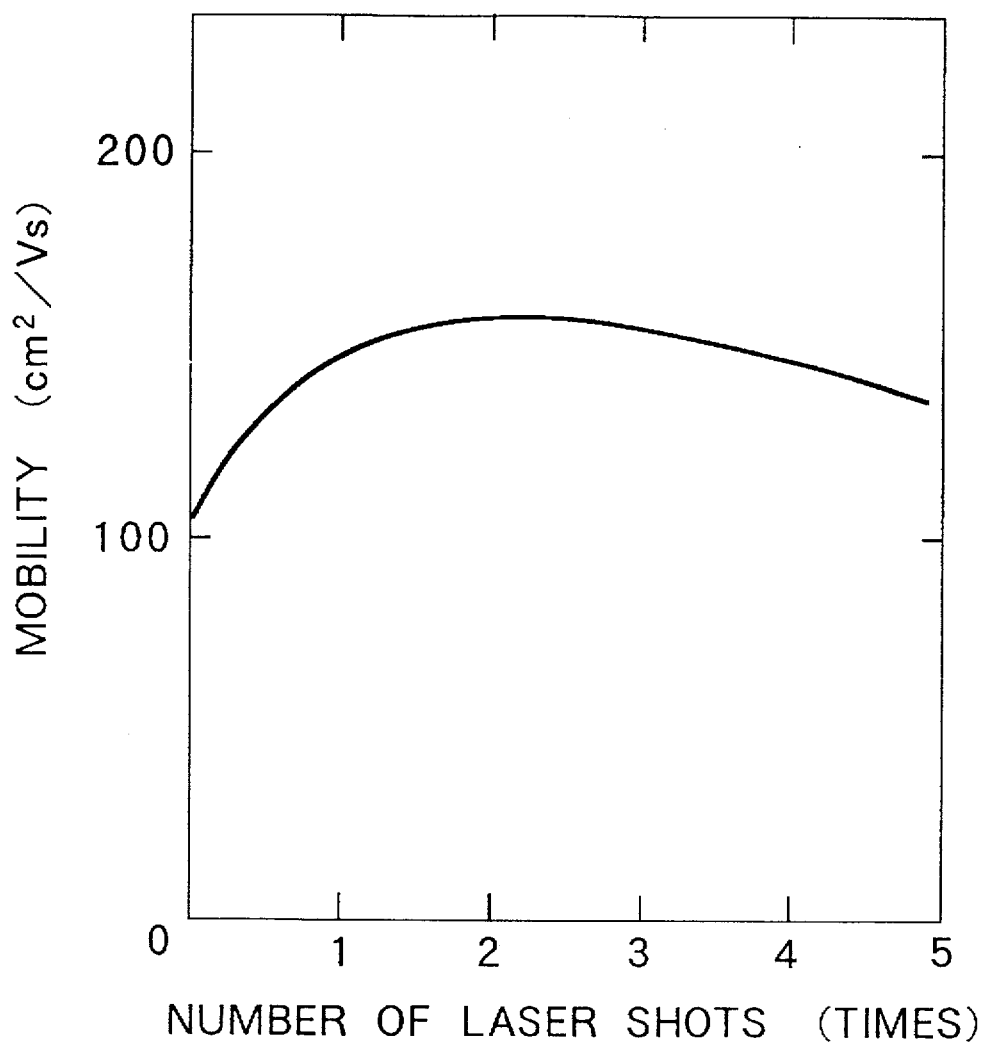
FIG. 7 is a graph illustrating the dependency of the electron mobility of a silicon-germanium thin film transistor on the number of laser shots.

Further, thin film transistors were produced fixing the film thickness of the amorphous germanium layer to 15 nm and varying the number of laser shots (number of exposure times) for converting the amorphous silicon layer and the amorphous germanium layer into polycrystalline layers, and the variation of the electron mobility of the thin film transistors thus produced was examined. In this instance, an excimer layer (XeCl) was used as the laser light source, and the wavelength and the irradiated power density were set to 304 nm and 400 mJ/cm², respectively. Results are illustrated in FIG. 7. As apparent from FIG. 7, in order to raise the electron mobility, it is preferable to set the number of laser shots to two or three.

While preferred embodiments of the present invention have been described using specific terms, such description is for illustrative purpose only, and is to be understood that changes and variations may be made without departing from the spirit or scope of the following claims.

What is claimed is:

1. A method of fabricating a polycrystalline silicon-germanium thin film transistor on an insulating substrate, comprising the steps of:

forming a conductive thin film on an insulating substrate and patterning the conductive thin film to form a source electrode and a drain electrode;

successively layering an amorphous silicon layer, an amorphous germanium layer and an insulating film on the insulating substrate on which the source electrode and the drain electrode are formed; and converting the amorphous silicon layer into a polycrystalline silicon layer, converting the amorphous germanium layer into a polycrystalline germanium layer and forming a gate electrode on the insulating film by patterning.

2. A method of fabricating a polycrystalline silicon-germanium thin film transistor on an insulating substrate, comprising the steps of:

forming a conductive thin film on an insulating substrate and patterning the conductive thin film to form a source electrode and a drain electrode;

successively layering an amorphous silicon layer, an amorphous germanium layer and an insulating film on the insulating substrate on which the source electrode and the drain electrode are formed; and performing annealing by irradiation of laser light to convert the amorphous silicon layer into a polycrystalline silicon layer, to convert the amorphous germanium layer into a polycrystalline germanium layer and to form a gate electrode on the insulating film by patterning.

3. The method of fabricating a polycrystalline silicon-germanium thin film transistor as set forth in claim 2, wherein the amorphous germanium layer is formed by a glow discharging method using a raw material gas containing fluorine and germane.

4. The method of fabricating a polycrystalline silicon-germanium thin film transistor as set forth in claim 3, wherein the amorphous silicon layer is formed by a glow discharging method using a raw material gas containing fluorine and silane.

5. The method of fabricating a polycrystalline silicon-germanium thin film transistor as set forth in claim 2, wherein the amorphous germanium layer is formed with a thickness greater than 2 nm but smaller than 20 nm.

6. The method of fabricating a polycrystalline silicon-germanium thin film transistor as set forth in claim 2, wherein the annealing is performed using an ultraviolet laser.

7. A method of fabricating a polycrystalline silicon-germanium thin film transistor on an insulating substrate, comprising the steps of:

forming a conductive thin film on an insulating substrate and patterning the conductive thin film to form a source electrode and a drain electrode;

successively layering an amorphous silicon layer, an amorphous germanium layer and an insulating film on the insulating substrate on which the source electrode and the drain electrode are formed; and performing annealing at a temperature higher than 600° C. to convert the amorphous silicon layer into a polycrystalline silicon layer, to convert the amorphous germanium layer into a polycrystalline germanium layer and to form a gate electrode on the insulating film by patterning.

8. The method of fabricating a polycrystalline silicon-germanium thin film transistor as set forth in claim 7, wherein the amorphous germanium layer is formed by a glow discharging method using a raw material gas containing fluorine and germane.

9. The method of fabricating a polycrystalline silicon-germanium thin film transistor as set forth in claim 8, wherein the amorphous silicon layer is formed by a glow discharging method using a raw material gas containing fluorine and silane.

10. The method of fabricating a polycrystalline silicon-germanium thin film transistor as set forth in claim 7, wherein the amorphous germanium layer is formed with a thickness greater than 2 nm but smaller than 20 nm.

* * * * *